(12) United States Patent
Tallone et al.

(10) Patent No.: US 7,450,621 B1
(45) Date of Patent: Nov. 11, 2008

(54) INTEGRATED LASER-DIFFRACTIVE LENS DEVICE

(75) Inventors: Luigi Tallone, Paesana (IT); Guido Alberto Roggero, Cirie (IT)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/768,235

(22) Filed: Jun. 26, 2007

(51) Int. Cl.
*H01S 5/00* (2006.01)
(52) U.S. Cl. .................... 372/43.01; 372/50.1
(58) Field of Classification Search ............ 372/75, 372/46.01, 50.1, 45.01, 43.01; 385/40, 49
See application file for complete search history.

(56) References Cited

U.S. PATENT DOCUMENTS

| | | | | |
|---|---|---|---|---|
| 5,987,202 A | * | 11/1999 | Gruenwald et al. | 385/49 |
| 6,101,204 A | * | 8/2000 | Johnston, Jr. | 372/50.1 |
| 6,459,716 B1 | * | 10/2002 | Lo et al. | 372/50.1 |
| 6,973,110 B2 | * | 12/2005 | Althaus et al. | 372/50.1 |
| 7,122,391 B2 | * | 10/2006 | Kuzma | 438/29 |

* cited by examiner

*Primary Examiner*—Minsun Harvey
*Assistant Examiner*—Tuan N. Nguyen

(57) ABSTRACT

A semiconductor laser device includes an edge-emitting laser monolithically integrated with a diffractive lens formed on the chip surface to emit a focalized or collimated beam in a direction perpendicular to the surface. An upper reflective surface and an angled reflective surface are formed in the chip upper surface. A lower reflective surface is formed in the chip lower surface. The laser, angled reflective surface, upper reflective surface, lower reflective surface and diffractive lens are oriented in relation to one another so that a first portion of the light emitted by the laser impinges directly upon the upper reflective surface, which reflects it onto the angled reflective surface, while a second portion of the light emitted by the laser impinges directly upon the angled reflective surface. The angled reflective surface reflects the light portions onto the lower reflective surface, which in turn reflects them through the diffractive lens.

12 Claims, 3 Drawing Sheets

INTEGRATED LASER-DIFFRACTIVE LENS DEVICE

TECHNICAL FIELD OF THE INVENTION

The invention relates generally to semiconductor lasers and, more specifically, to a device in which a laser and diffractive lens are integrated with each other on the same chip.

BACKGROUND OF THE INVENTION

Semiconductor lasers are commonly used in optical transceivers for telecommunications and data communication networks. The lasers used in such optical transceivers are commonly of the edge-emitting type. The edge-emitting laser of an optical transceiver is commonly coupled to the fiber with an aspheric lens or other discrete optical element because the light that the laser emits is not focalized or collimated, i.e., it diverges in a cone shape as it propagates. While the use of lenses to couple edge-emitting lasers to fibers in optical transceivers works reasonably well, it would be desirable to improve transceiver manufacturing economy by minimizing the number of transceiver parts and the attendant steps needed to achieve optical alignment among them.

Edge-emitting lasers for optical transceivers are fabricated on semiconductor wafers using standard photolithographic and epitaxial methods, diced into chips, and portions of each chip coated with reflective and anti-reflective coatings. The finished chips can then be tested. It would be desirable to minimize the number of manufacturing steps as well as to enhance testability.

Surface-emitting laser chip devices, in which a diffractive lens is integrated with an edge-emitting laser on the same chip, have been described. For example, in U.S. Pat. No. 6,459,716 to Lo et al. a device is described in which the edge-emitted beam is reflected by an angled surface toward a lower reflective surface that is parallel to the beam-emission direction and parallel to the chip surface, which in turn reflects the beam upwardly in a direction generally perpendicular to the chip surface, where it is emitted through a diffractive lens formed in a material on the chip surface. A transceiver having such a device can be manufactured more economically than one in which a separate lens is included. Nevertheless, the device is not straightforward to fabricate due to the inclusion of a waveguide to direct the beam from the laser toward the angled surface. Also, the geometry of the device may make its optical characteristics sensitive to wafer thickness errors.

It would be desirable to provide a device in which a laser and diffractive lens are monolithically integrated, and that is economical to manufacture. The present invention addresses these problems and deficiencies in the manner described below.

SUMMARY OF THE INVENTION

The present invention relates to a semiconductor laser device in which an edge-emitting laser is monolithically integrated with a diffractive lens formed on the chip surface to emit a focalized or collimated beam in a direction substantially perpendicular to the chip surface. The chip substrate has upper and lower surfaces. An upper reflective surface and an angled reflective surface are formed in the chip upper surface. A lower reflective surface is formed in the lower surface of the chip. In an exemplary embodiment of the invention, the angled reflective surface can comprise a wall of a groove formed in the chip upper surface.

In the exemplary embodiment, the laser, angled reflective surface, upper reflective surface, lower reflective surface and diffractive lens are oriented in relation to one another so that a first portion of the diverging light beam emitted by the laser impinges directly upon the upper reflective surface, which reflects it onto the angled reflective surface, while a second portion of the diverging light beam emitted by the laser impinges directly upon the angled reflective surface. The angled reflective surface reflects the light beam portions onto the lower reflective surface, which in turn reflects them through the diffractive lens.

The two light beam portions merge at the diffractive lens. Accordingly, and as will become apparent from the detailed descriptions below of one or more exemplary embodiments, by selecting the geometry or relative orientations among the laser, angled reflective surface, upper reflective surface, lower reflective surface and diffractive lens, one can achieve a desired or selected aperture for the resulting merged or combined beam.

Note that the terms "light" and "light beam" are used for purposes of convenience and clarity to refer to the radiation emitted by the laser and are not to be construed as limiting the radiation to visible light or any other specific wavelengths. Rather, the laser can emit any suitable type of light. It should also be noted that the terms "first light beam portion" and "second light beam portion" and similar terms are used for purposes of convenience and clarity only, as the two beams are not in actuality entirely distinguishable from each other as they impinge upon some portions of the angled reflective surface, lower reflective surface, and diffractive lens. Also, the terms "in" and "on," as used with regard to the substrate or chip surfaces "in" or "on" which the features described herein are formed, are intended to refer to the exemplary embodiment for illustrative purposes only; unless explicitly stated otherwise, a feature of the invention that is described herein as formed "in" another element can in other embodiments be formed "on" the other element, and vice versa.

The device can be coupled directly to an optical fiber without using a separate lens because the beam emerges from the device already focalized or collimated. (Nevertheless, a lens, such as an economical ball lens, can be used if desired.) Furthermore, the above-described surface-emitting arrangement facilitates economical manufacture because not only does the structure minimize the number of individual parts and structural elements, but also the anti-reflective coating (i.e., a coating of the type that is commonly applied to the laser emission facet at the chip edge of a conventional device) can be applied to the entire wafer upper surface before dicing the wafer into individual chips. Also, the surface-emitting arrangement of the devices enables them to be tested before dicing the wafer into individual chips by applying probes to electrical contacts formed in the chip surface and measuring radiation emitted from the chip surface in response.

These and other features and advantages of the invention will become apparent from the following description, drawings and claims.

DETAILED DESCRIPTION OF AN ILLUSTRATIVE EMBODIMENT

Figure 1:
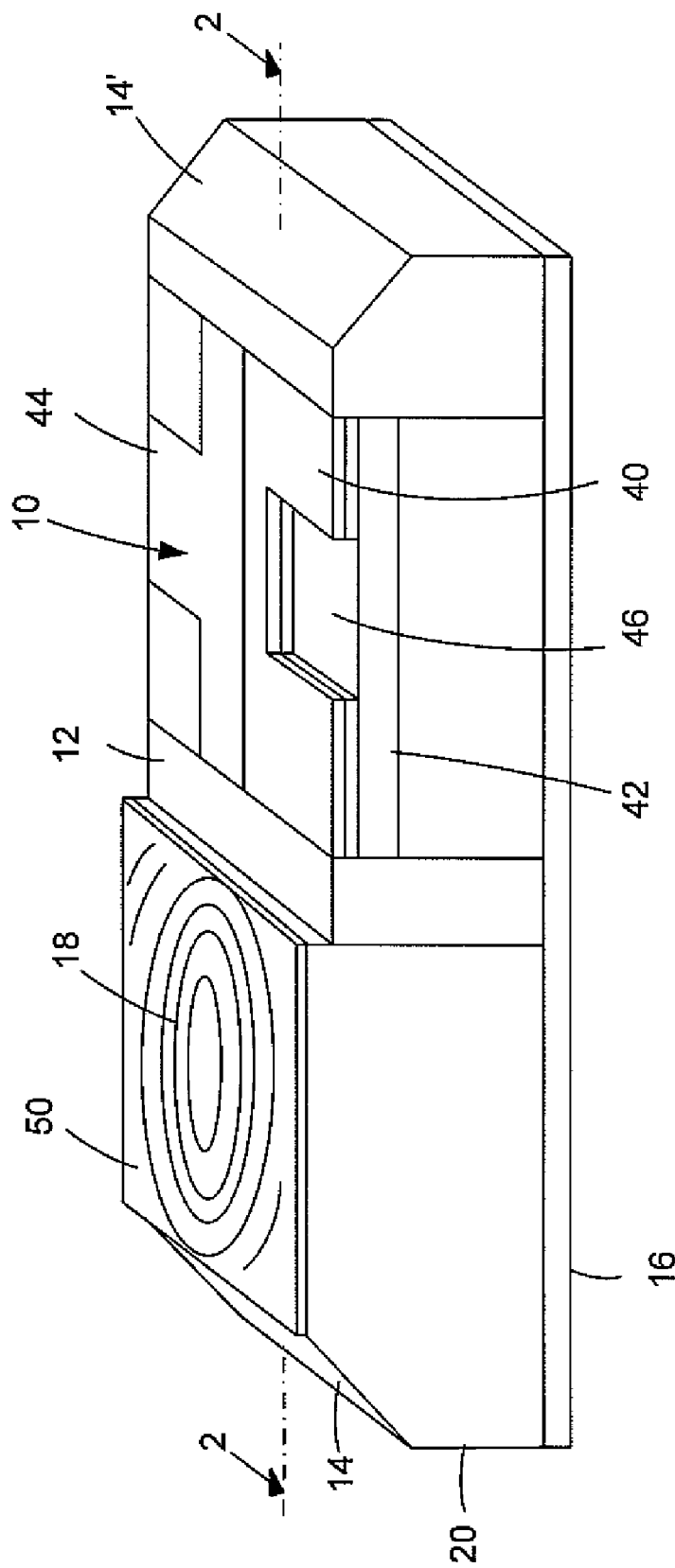
FIG. 1 is perspective view of a laser device in accordance with an exemplary embodiment of the invention.

As shown in FIG. 1 (not to scale), in an illustrative or exemplary embodiment of the invention, a laser device includes an edge-emitting laser 10, an upper mirror 12, an angled mirror 14, a lower mirror 16, and a diffractive lens 18. These elements are formed on or in a suitable semiconductor substrate 20, such as doped indium phosphide (InP). The formation of such lasers is well known in the art but is nonetheless described in some additional detail below. Note that the term "mirror" is used herein for purposes of convenience and clarity and in accordance with its ordinary meaning in the art to refer to a surface that is highly or substantially reflective with respect to the radiation wavelengths emitted by laser 10. The reflection on upper mirror 12 is obtained by total reflection.

Figure 2:
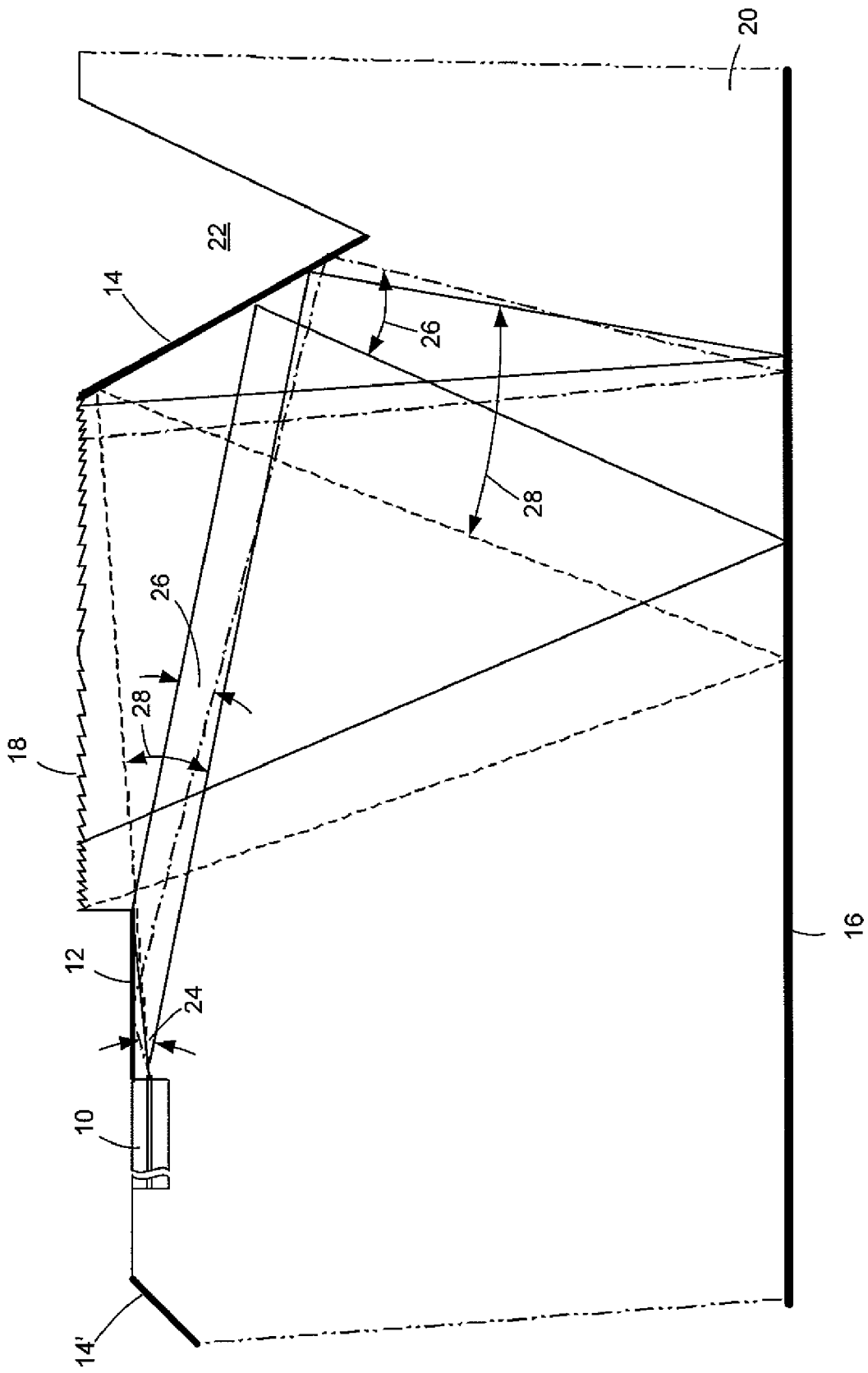
FIG. 2 is a sectional view taken on line 2-2 of FIG. 1.

As shown in FIG. 2 (not to scale), substrate 20 has a generally planar or flat, bar-like shape, in accordance with conventional chip technologies in which a large number of devices (chips) are fabricated on a correspondingly generally planar semiconductor wafer (not shown), which is then diced into the individual devices following some or all of the fabrication steps. In accordance with conventional edge-emitting laser technology, laser 10 emits a light beam generally along an axis that is parallel to the substrate plane.

Upper mirror 12 has a planar shape and is disposed on the upper surface of substrate 20, adjacent the emitting end of laser 10, between laser 10 and diffractive lens 18. In other words, the order in which these elements are arranged on the upper surface along an axis parallel to the plane of substrate 20 is: laser 10, followed by upper mirror 12, followed by diffractive lens 18, followed by angled mirror 14. Note that diffractive lens 18 also has a planar shape and is disposed on the upper surface of substrate 20 parallel to upper mirror 12. Accordingly, upper mirror 12 is parallel to the emission axis of laser 10 and parallel to diffractive lens 18.

Angled mirror 14 has a planar shape and comprises one wall of a V-shaped groove 22 in the upper surface of substrate 20. Lower mirror 16 has a planar shape and is formed on the lower surface of substrate 20. Accordingly, lower mirror 16, upper mirror 12, and diffractive lens 18 are mutually parallel to one another and to the emission axis of laser 10.

In operation, the light beam 24 emitted by laser 10 (along the emission axis) diverges somewhat as it propagates (as represented by the beam divergent angle), and a first beam portion 26 impinges directly upon upper mirror 12, while a second beam portion 28 impinges directly upon angled mirror 14. Note that beam portions 26 and 28 are not in actuality entirely distinguishable from each other at all points along their propagation paths but rather are referred to herein as "portions" or "virtual beams" for purposes of convenience and clarity only.

It can also be noted that the portion of substrate 20 through which beam portions 26 and 28 propagate is a free-propagation region, i.e., it has no waveguides or other elements that direct the beam. This straightforward arrangement enhances economy of manufacture.

Angled mirror 14 reflects beam portions 26 and 28 onto lower mirror 16. Lower mirror 16, in turn, reflects beam portions 26 and 28 toward diffractive lens 18. Beam portions 26 and 28 effectively merge as they pass through diffractive lens 18. Accordingly, a beam emerges from the device oriented along an axis substantially perpendicular to the upper surface of the device. For this reason, the device can be referred to as "surface-emitting."

The invention allows one to make a device that has any selected beam aperture for the surface-emitted beam by suitably orienting laser 10, upper mirror 12, angled mirror 14, and diffractive lens 18 with respect to one another, because beam portions 26 and 28 effectively combine or overlap as they pass through diffractive lens 18 to an extent that is responsive to the relative orientation of these elements with respect to one another.

Figure 3:
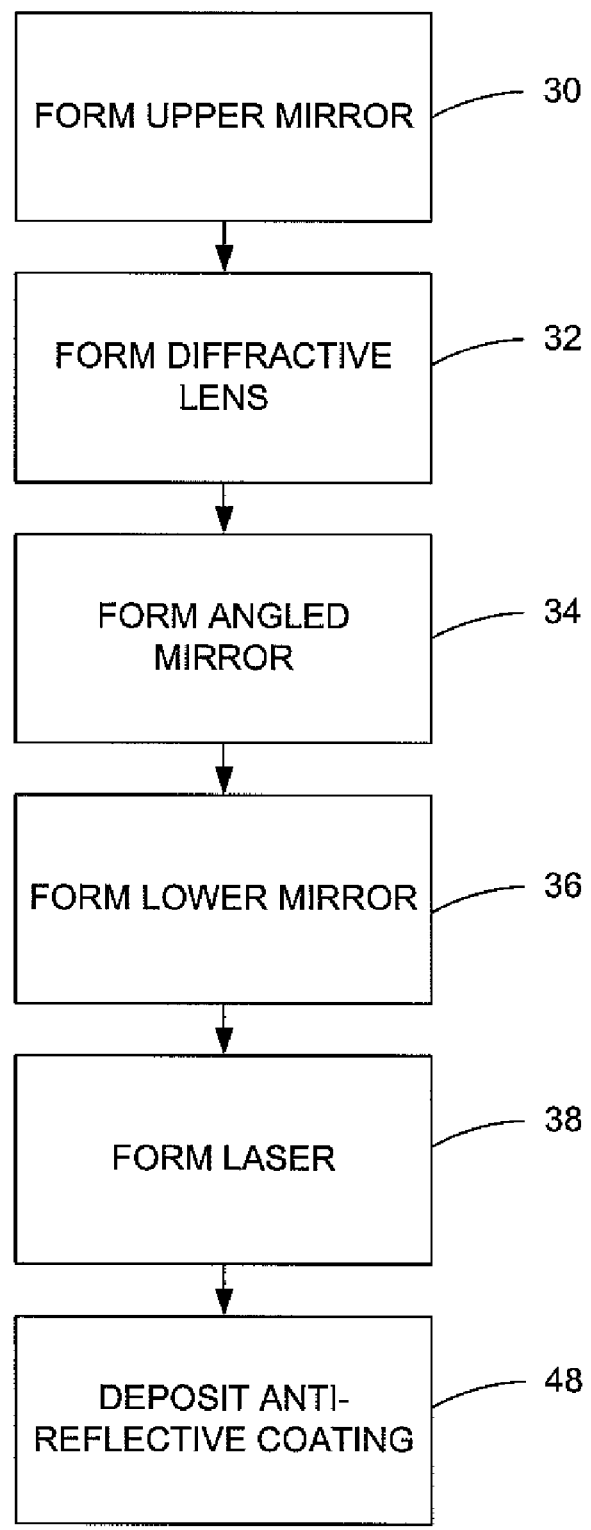
FIG. 3 is a process flow diagram, illustrating a method for making the device.

The device can be fabricated using conventional techniques. Exemplary steps for making the device are illustrated in FIG. 3, but the order of the steps is intended only for purposes of illustration, and the steps can be performed in any other suitable order. Furthermore, additional steps of the type commonly used in fabricating such devices can be included, as persons skilled in the art can readily appreciate. At step 30, upper mirror 12 is formed on the upper surface of substrate 20 by depositing a suitable reflective coating. At step 32, diffractive lens 18 is formed in the upper surface of substrate 20 by, for example, electron beam lithography and reaction ion etching. A conventional butt-join growth technique can be used to integrate the portion of the device in which laser 10 is formed with the portion of the device in which diffractive lens 18 is formed. At step 34, angled mirror 14 is formed in the upper surface of substrate 20 by etching V-shaped groove 22 and depositing a suitable reflective coating. At step 36, lower mirror 16 is formed in the lower surface of substrate 20.

As indicated by step 38, laser 10 is formed in substrate 20 by, for example, a suitable conventional multi-quantum-well process. As described above, substrate 20 can comprise any suitable material, such as Fe-doped InP. With further reference to FIG. 1, in forming laser 10, the InP p region 40 and InP n region 42, as well as the p electrical contact 44 and n electrical contact 46 are all formed in the upper surface of the InP substrate 20.

Note that the above-described elements can be formed in any desired positions and orientations with respect to each other. The positions and orientations of the above-described elements dictate the shapes and relative orientations of beam portions 26 and 28 (e.g., their width, angular separation, etc.). Thus, by selecting such positions and relative orientations of the above-described elements, one can achieve a desired or selected aperture for the combined beam that results from the merging of beam portions 26 and 28 as they pass through diffractive lens 18.

Referring again to FIG. 3, at step 48 an anti-reflective coating 50 can be deposited on the upper surface, over the above-described elements that have been formed thereon. Note that the above-described steps can be performed upon the wafer (not shown) before the wafer is diced into individual devices. Advantageously, the devices can be tested while still part of the wafer because lens 18 and p and n electrical contacts 44 and 46, which are the elements to which access is required during testing, are exposed and accessible. Devices that fail testing can be marked at an early stage to facilitate efforts to maximize yield.

It should be noted that the invention has been described with reference to one or more illustrative embodiments for the purposes of demonstrating the principles and concepts of the invention and to provide one or more examples of the manner in which the invention may be implemented. The invention is not limited to these embodiments, as will be understood by persons skilled in the art in view of the description provided herein. Those skilled in the art will understand that various modifications may be made to the embodiments described herein and that it is intended that the present invention cover all such modifications and variations provided that they come within the scope of any claims and their equivalents. With regard to the claims, no claim is intended to invoke the sixth paragraph of 35 U.S.C. Section 112 unless it includes the term "means for" followed by a participle.

What is claimed is:

1. A laser device, comprising:

a semiconductor substrate having an upper surface and a lower surface, the upper surface having formed therein an upper reflective surface, a diffractive lens, and an angled reflective surface, the lower surface having formed therein a lower reflective surface;

an edge-emitting laser formed in the semiconductor substrate for emitting a diverging light beam into the substrate along an emission axis, said emission axis being substantially parallel to the upper reflective surface, substantially parallel to the lower reflective surface, and intersecting the angled reflective surface at a non-zero angle; and wherein the laser, angled reflective surface, upper reflective surface, lower reflective surface and diffractive lens are oriented in relation to one another for a first portion of the diverging light beam to impinge directly upon the upper reflective surface and a second portion of the diverging light beam to impinge directly upon the angled reflective surface, and wherein the angled reflective surface reflects the impinging first and second portions onto the lower reflective surface, and the lower reflective surface reflects the first and second portions through the diffractive lens.

2. The laser device claimed in claim 1, wherein the upper surface has a groove formed therein, and the angled reflective surface is a wall of the groove.

3. The laser device claimed in claim 1, wherein the portion of the substrate between the laser and the angled reflective surface is a free-propagation region through which the light beam propagates.

4. The laser device claimed in claim 1, wherein the substrate is doped InP.

5. The laser device claimed in claim 1, wherein n and p electrical contacts of the laser are disposed on the upper surface of the semiconductor substrate.

6. A method for making a laser device, comprising:

forming an upper reflective surface in an upper surface of a semiconductor substrate;

forming a diffractive lens in an upper surface of a semiconductor substrate;

forming an angled reflective surface an upper surface of a semiconductor substrate;

forming a lower reflective surface in a lower surface of the semiconductor substrate;

forming an edge-emitting laser formed in the semiconductor substrate, the laser oriented to emit a diverging light beam into the substrate along an emission axis substantially parallel to the upper reflective surface, substantially parallel to the lower reflective surface, and intersecting the angled reflective surface at a non-zero angle; and wherein the laser, angled reflective surface, upper reflective surface, lower reflective surface and diffractive lens are formed in orientations in relation to one another for a first portion of the diverging light beam to impinge directly upon the upper reflective surface and a second portion of the diverging light beam to impinge directly upon the angled reflective surface, and wherein the angled reflective surface reflects the impinging first and second portions onto the lower reflective surface, and the lower reflective surface reflects the first and second portions through the diffractive lens.

7. The method claimed in claim 6, further comprising the steps of selecting a beam aperture and orienting the laser, the angled reflective surface, upper reflective surface, lower reflective surface and diffractive lens in relation to each other for the first and second portions to merge as they pass through the diffractive lens into a beam having the selected aperture.

8. The method claimed in claim 6, wherein the step of forming an angled reflective surface an upper surface of a semiconductor substrate comprises forming a groove in the upper surface of the semiconductor substrate.

9. The method claimed in claim 6, wherein the step of forming a diffractive lens in an upper surface of a semiconductor substrate comprises semiconductor etching.

10. The method claimed in claim 6, wherein the step of forming an edge-emitting laser comprises forming a p electrical contact and an n electrical contact on the upper surface of the semiconductor substrate.

11. The method claimed in claim 6, wherein the step of forming an edge-emitting laser comprises forming a multiple-quantum-well active region on the upper surface of the semiconductor substrate.

12. The method claimed in claim 6, further comprising coating an upper surface of the laser device with an anti-reflective coating.

* * * * *

UNITED STATES PATENT AND TRADEMARK OFFICE
CERTIFICATE OF CORRECTION

PATENT NO. : 7,450,621 B1 Page 1 of 1
APPLICATION NO. : 11/768235
DATED : November 11, 2008
INVENTOR(S) : Luigi Tallone et al.

It is certified that error appears in the above-identified patent and that said Letters Patent is hereby corrected as shown below:

Column 5, Line 44, Claim 6, after "surface" insert -- in --.

Signed and Sealed this

Ninth Day of November, 2010

David J. Kappos
*Director of the United States Patent and Trademark Office*